(12) United States Patent
Higashida et al.

(10) Patent No.: US 7,214,887 B2
(45) Date of Patent: May 8, 2007

(54) ELECTRONIC CIRCUIT CONNECTING STRUCTURE, AND ITS CONNECTING METHOD

(75) Inventors: Takaaki Higashida, Osaka (JP); Kenichi Yamamoto, Osaka (JP); Daisuke Suetsugu, Higashiosaka (JP); Miyuki Nagaoka, Hirata (JP); Takashi Imanaka, Kadoma (JP); Toshinari Nitta, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 74 days.

(21) Appl. No.: 10/844,695

(22) Filed: May 13, 2004

(65) Prior Publication Data

US 2004/0231878 A1    Nov. 25, 2004

(30) Foreign Application Priority Data

May 19, 2003   (JP)   ............................. 2003-140162

(51) Int. Cl.
    *H05K 1/16*   (2006.01)
(52) U.S. Cl. .................. 174/260; 174/254; 439/74
(58) Field of Classification Search ................ 174/260, 174/261, 254, 262; 361/760, 767, 774, 777; 439/55, 65, 66, 67, 74
    See application file for complete search history.

(56) References Cited

U.S. PATENT DOCUMENTS 4,950,527 A * 8/1990 Yamada ...................... 428/192
5,477,419 A * 12/1995 Goodman et al. .......... 361/760
6,138,348 A * 10/2000 Kulesza et al. ................ 29/840
6,252,301 B1 * 6/2001 Gilleo et al. ................. 257/690
6,297,560 B1 * 10/2001 Capote et al. ............... 257/778
6,329,610 B1 * 12/2001 Takubo et al. .............. 174/264
6,335,571 B1 * 1/2002 Capote et al. ............... 257/787
6,384,339 B1 * 5/2002 Neuman ...................... 174/254
6,527,162 B2 * 3/2003 Totani et al. ................ 228/175
6,528,892 B2 * 3/2003 Caletka et al. .............. 257/781
6,627,998 B1 * 9/2003 Caletka et al. .............. 257/778

FOREIGN PATENT DOCUMENTS

| JP | 08-032195 A | 2/1996 |
| JP | 09-082759 A | 3/1997 |

* cited by examiner

*Primary Examiner*—Ishwar (I. B.) Patel
(74) *Attorney, Agent, or Firm*—RatnerPrestia

(57) ABSTRACT

A connecting structure includes a circuit board with a first connection land having a plurality of conductor patterns on the surface thereof, a second connection land disposed in a position opposite to the first connection land of the circuit board, and a flexible board including an insulating layer formed so as to surround at least a part of outer periphery of the second connection land. The first connection land and the second connection land are bonded to each other with a bonding member, and the insulating layer is thicker than the total thickness of the second connection land and the first connection land. It is possible to obtain an electronic circuit connecting structure which is free from short-circuit due to running of the bonding member such as solder even with the connecting land greatly reduced in size, and its connecting method.

6 Claims, 8 Drawing Sheets

ELECTRONIC CIRCUIT CONNECTING STRUCTURE, AND ITS CONNECTING METHOD

FIELD OF THE INVENTION

The present invention relates to a connecting structure between a circuit board with electronic circuits mounted thereon and a flexible board, and its connecting method.

BACKGROUND OF THE INVENTION

Recently, electronic equipment has been remarkably improved in performance, reduced in thickness, weight and size. For example, in the case of a portable telephone, it is equipped with camera function and increased in size of the display screen, remaining almost unchanged in overall shape and weight as compared with a conventional type. In order to make electronic equipment higher in performance and reduced in size, it is necessary to build as many electronic circuits as possible into a limited space. For efficiently using a limited space, besides the use of only a conventional printed circuit board, the use of both flexible board and printed circuit board is increasing. In the case of using both flexible board and printed circuit board, it is necessary to make the connection of these in reliable manner. Particularly, as the connecting pitch becomes lessened, short-circuit is liable to take place due to solder or the like between conductor patterns connected, and it is very important to prevent such short-circuit.

As an example of method for preventing such short-circuit, a method is disclosed in Japanese Laid-open Patent H8-32195. This method comprises the steps of laminating a circuit board with a first connection land group having a plurality of connection lands to a flexible board with a second connection land group arranged so as to be respectively opposed to the plurality of connection lands of the first connection land group, and connecting the connection lands to each other. Specifically, it is characterized in that an insulating layer having the following structure is formed and connected to a circuit board. That is, an insulating layer is formed so as to surround each of the plurality of connection lands of the first connection land group, and the insulating layer is structurally higher than the height of the first connection land from the surface of the circuit board. Thus, the connection land is structurally arranged inside the opening of the insulating layer. In such a structure, each of the second connection lands formed on the flexible board is fitted in the range surrounded by the insulating layer of the circuit board, and the second connection lands of the flexible board may be reliably connected in opposed positions to the first connection lands of the circuit board. Further, when the connection lands are connected to each other by soldering, the solder is restricted by the wall of the insulating layer and prevented from protruding sideways, thereby improving the reliability as disclosed.

Also, as another example, a method is disclosed in Japanese Laid-open Patent H9-82759. In this example, a projected electrode and solder layer are formed on a flexible board, and a spacer is provided around them. In this configuration, when the projected electrode of a flexible board is connected to the connecting terminal of a circuit board by means of the solder layer, the generation of short-circuit can be prevented because the spacer serves to prevent the solder from running.

In the first example, since the opening of the insulating layer formed on the circuit board is used as a guide for positioning the first connection land of the circuit board and the second connection land of the flexible board, positional deflection hardly takes place and it is possible to perform accurate soldering. However, when the connecting pitch is lessened, there arise the following problems. That is, if intended to make the connection with a fine pitch, it is necessary to make the second connection land formed on the flexible board less in thickness than the conventional configuration. If the second connection land of the flexible board is reduced in thickness, the insulating layer on the circuit board in the first example will be hard to effectively prevent the solder from running.

Also, in the second example, there is provided a spacer at the flexible board side, and the spacer serves to prevent the solder layer from running. However, a plating method is employed for forming a solder layer on the projected electrode of the flexible board. Accordingly, it becomes necessary to include an additional step to prevent other portions of the flexible board from being plated. Also, for mounting by reflow soldering together with other electronic parts to be mounted on the circuit board, it is desirable to use same solder material, but same solder material is not always available for plating, and it is sometimes difficult to execute such reflow soldering.

SUMMARY OF THE INVENTION

The present invention has been made taking these points into consideration, and the object of the invention is to provide an electronic circuit connecting structure which is free from short-circuit caused due to running of bonding member such as solder even with the connecting pitch lessened, and its connecting method.

The electronic circuit connecting structure of the present invention comprises:

a circuit board with a plurality of first connection lands, which are conductor patterns, formed on the surface thereof; and a flexible board arranged opposite to the circuit board, the flexible board including:

second connection lands arranged opposite to the first connection lands of the circuit board; and an insulating layer formed so as to surround at least a part of an outer periphery of the second connection lands, wherein the first connection land and the second connection land are bonded to each other via a bonding member, and the thickness of the insulating layer is greater than a total thickness of the first connection land and the second connection land.

In this configuration, when the first connection land of the circuit board is connected to the second connection land of the flexible board, the bonding member is reliably kept within the region surrounded by the insulating layer and prevented from running out into the space between the connection lands. Also, when the flexible board is pressed against the circuit board, it is restricted by the insulating layer, and therefore, such a force as to push and cause the bonding member to run is hard to be applied. Accordingly, even with the pitch of the connecting land lessened, the generation of troubles like short-circuit can be greatly reduced, displaying remarkable effects to increase the electronic circuit density and to improve the reliability.

DETAILED DESCRIPTION OF THE EXEMPLARY EMBODIMENT

Figure 1:
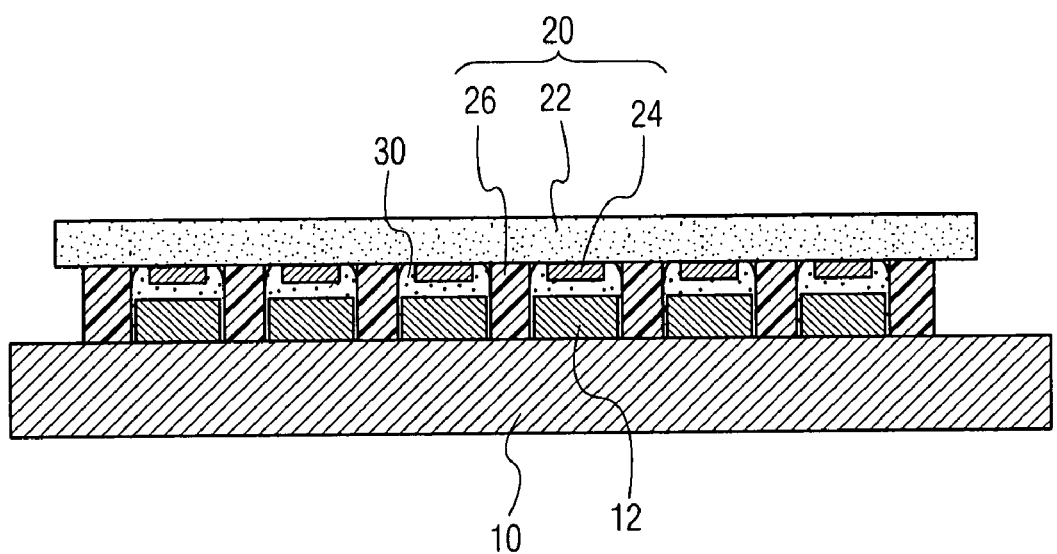
FIG. 1 is a sectional view of an electronic circuit connecting structure in the first exemplary embodiment of the present invention.

The exemplary embodiments of the present invention will be described in the following with reference to the drawings. Incidentally, the same elements are given same reference numerals, and the description is sometimes omitted.

First Exemplary Embodiment

FIG. 1 is a sectional view showing an electronic circuit connecting structure in the first exemplary embodiment of the present invention. Circuit board 10 is configured in that a land (not shown) for mounting electronic parts (not shown) and conductor patterns (not shown) for connecting these parts are formed, and the first connection land 12 comprising a part of such conductor patterns is formed on surface thereof. The circuit board 10 is also preferable to be further formed with multilayer wiring, internally equipped with electronic parts or formed with passive parts and the like by a film forming method. These configurations are not subjected to any particular limitations. Electronic parts represents a general term for passive parts and semiconductor elements.

Flexible board 20 comprises substrate 22, second connection land 24 having a part of conductor patterns formed on the substrate 22, and insulating layer 26 formed so as to surround at least a part of outer peripheries of the second connection land 24. The flexible board 20 is also extended from the second connection land 24 and formed with a plurality of conductor patterns which are however not shown. Also, in some cases, electronic parts are mounted in such manner as to be connected to conductor patterns, or passive elements or functional circuit elements are formed by a film forming method. As passive elements, for example, resistor elements, capacitor elements or inductor elements are typical examples. Also, as functional circuit elements, for example, there are sensors and thin film transistors.

The flexible board 20 and the circuit board 10 are bonded to each other by bonding member 30 between the first connection land 12 and the second connection land 24, thereby comprising an electronic circuit connecting structure. As the bonding member 30, it is preferable to form the member on the first connection land 12 by a printing method with the use of generally available cream solder in order to execute solder bonding. Or, it is preferable to form the member similarly by a printing method with the use of conductive adhesive in order to execute adhesive bonding.

As is seen in FIG. 1, when the first connection land 12 and the second connection land 24 are positioned to each other, the bonding member 30 is enclosed in a space formed by the first connection land 12 and the insulating layer 26 and will not run out to adjacent connection lands. This is because, as shown in FIG. 1, the first connection land 12 is formed thicker than the second connection land 24, and also the insulating layer 26 is formed thicker than a total thickness of the first connection land 12 and the second connection land 24. In such a configuration, even when the flexible board 20 is positioned to the circuit board 10 and is pressed against the circuit board 10, a clearance is maintained between the flexible board 20 and the circuit board 10 for thickness restricted by the insulating layer 26. Also, since the insulating layer 26 is fitted between the first connection lands 12, it is possible to reliably prevent the bonding member 30 from running out of the connection land region.

Figure 2A:
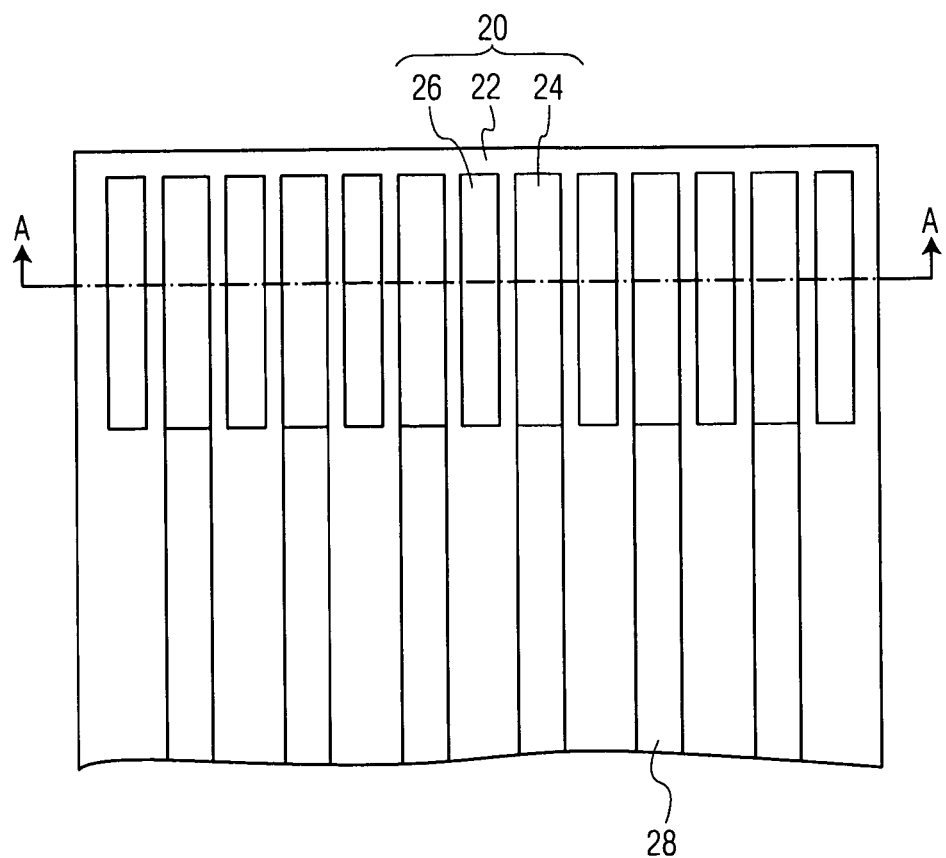
FIG. 2A is a plan view showing the region of a second connection land of a flexible board used for electronic circuits of the exemplary embodiment.
Figure 2B:
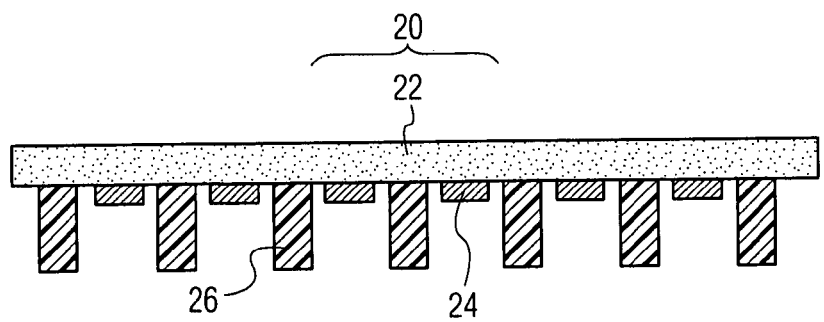
FIG. 2B is a sectional view along the A—A line shown in FIG. 2A.
Figure 3A:
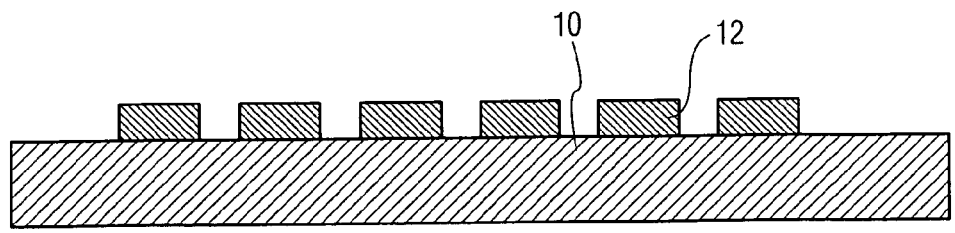
FIG. 3A is a sectional view showing the region of a first connection land of a circuit board used for electronic circuits of the exemplary embodiment.
Figure 3B:
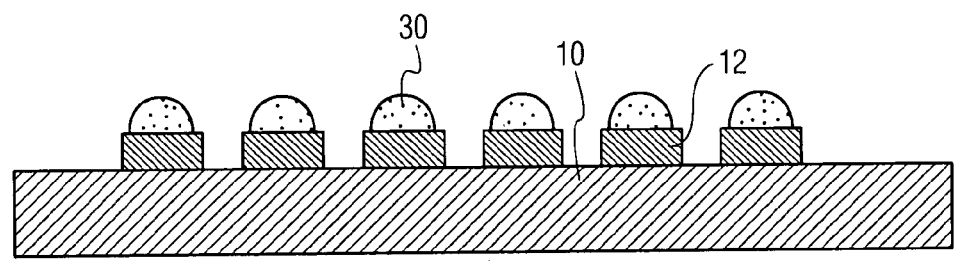
FIG. 3B is a sectional view showing a state of bonding member formed on the first connection land of a circuit board used for electronic circuits of the exemplary embodiment.
Figure 3C:
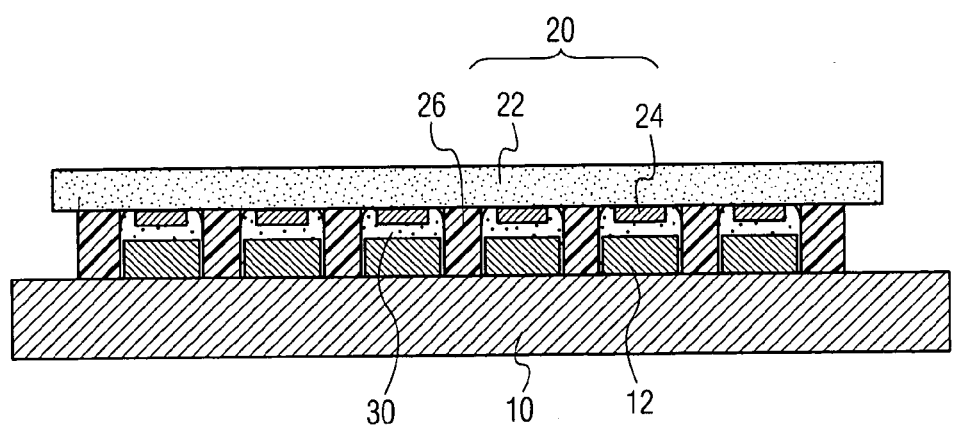
FIG. 3C is a sectional view showing a state of a flexible board and a circuit board positioned to each other in an electronic circuit connecting structure of the exemplary embodiment.

The electronic circuit connecting method of the present exemplary embodiment will be described in the following with reference to FIG. 2A to FIG. 3C. FIG. 2A is a plan view showing the second connection land region of a flexible board. Also, FIG. 2B is a sectional view along the A—A line shown in FIG. 2A. Also, FIG. 3A is a sectional view of the first connection land region of a circuit board. Further, FIG. 3B is a sectional view showing a state of bonding member formed on the first connection land. Also, FIG. 3C is a sectional view showing a state of a flexible board being positioned.

As shown in FIG. 2A, the flexible board 20 is formed with the second connection land 24 at the end portion of the substrate 22. Conductor pattern 28 is extended from the second connection land 24, thereby forming a specified circuit in a region not shown. There is provided the insulating layer 26 so as to surround at least a part of outer periphery of the second connection land 24. In this exemplary embodiment, the insulating layer 26 is formed at both sides of the second connection land 24 as a strip. The interval between the insulating layers 26 is at least wider than the first connection land 24. That is, as shown in FIG. 3C, the width is set so that the insulating layer 26 may be fitted between the first connection lands 12 when the second connection land 24 of the flexible board 20 is positioned to the first connection land of the circuit board 10. Making the width setting like this, the insulating layer 26 is fitted between the first connection lands 12 when positioned, and spaces are formed respectively between the first connection land 12 and the second connection land 24 and between the second connection land 24 and the insulating layer 26. As a result, when the flexible board 20 is pressed against the circuit board 10, the bonding member 30 is maintained in such spaces and can be prevented from running into adjacent lands.

As the substrate 22, polyimide resin film generally used as the flexible board 20 is preferable, but the present invention is not limited to this. When conductive adhesive is used as the bonding member 30, the bonding temperature is lower than soldering temperature, and for example, it is possible to use polyethylene terephthalate (PET) resin film or the like.

Also, the second connection land 24 is preferable to be configured in that a copper (Cu) layer is formed on the conductor pattern 28 and that a gold (Au) layer is formed on the uppermost surface, but the present invention is not limited to this. For example, it is also preferable to form only Cu layer or to form Au layer on a silver (Ag) layer or a nickel (Ni) layer. Or, when the material for the conductor pattern 28 is solderable or stable even if bonded by conductive adhesive, it is preferable to use a part of the conductor pattern 28 itself as the second connection land 24.

Further, as the conductor pattern 28, there is no particular limit to the material provided that it is low in specific resistance and well adhesive to the substrate such as Cu layer and aluminum (Al) layer. For example, it can be formed by printing a conductive paste.

Further, the insulating layer 26 can be formed by a printing or drawing method using a resin material such as solder resist or the like. Also, it is possible to realize highly accurate patterning through photolithography and etching of a photosensitive resin material. Also, it is possible to use acrylic resin.

The insulating layer 26 is formed thicker than the total thickness of the first connection land 12 and the second connection land 24. The thickness can be prescribed as follows. That is, the thickness of the insulating layer 26 should satisfy such condition that the volume of space created by the insulating layer 26 is nearly equal to the amount of bonding member 30 applied. Prescribing the respective width and thickness of the first connection land 12 and the second connection land 24, the width of insulating layer 26, and the amount of bonding member 30 applied, it is possible to obtain the volume of space that depends upon the first connection land 12, the second connection land 24 and the insulating layer 26, and thus, the necessary thickness of the insulating layer 26 can be obtained.

FIG. 3A is a sectional view of the region of the first connection land 12 of the circuit board 10. The circuit board 10 is configured in that a land (not shown) formed with mutilayer wiring (not shown) and mounted with electronic parts on the surface layer, and conductor patterns (not shown) for connecting these parts are formed, and the first connection land 12 is further formed at a part of the conductor patterns. The circuit board 10 is not limited to such a configuration, and there is no particular limit to the configuration of the electronic circuit provided that it includes the first connection land 12. Also, the circuit board 10 is preferable to be internally equipped with electronic parts or formed with passive parts by a film forming method.

The bonding member 30 is formed on the surface of the first connection land 12 of the circuit board 10. A state of bonding member 30 thus formed is shown in FIG. 3B. As the forming method, a screen printing, drawing or ink jet method can be employed by using the bonding member 30 adjusted to a specified viscosity. The amount of the bonding member 30 applied is prescribed in relation to the thickness of the insulating layer 26. The bonding member 30 is to be formed only on the surface layer of the first connection land 12 as shown in FIG. 3B. Thus, with the member formed only on the surface layer, when the flexible board 20 is positioned and pressed against the circuit board 10, the insulating layer 26 can be opposed to the surface of the circuit board 10 without catching the bonding member 30.

After the bonding member 30 is formed on the first connection land 12, the flexible board 20 is positioned and pressed down as shown in FIG. 3C. In this case, the interval between the substrate 22 and the circuit board 10 is restricted by the insulating layer 26. Also, since the bonding member 30 is enclosed by the first connection land 12 and the insulating layer 26 provided at each side thereof, it is possible to reliably prevent the bonding member 30 from running out of the connecting region. After being configured like this, heating the bonding member 30 at least will complete the bonding between the first connection land 12 and the second connection land 24.

As the bonding member 30, solder most frequently used for mounting electronic parts or conductive adhesive or the like whose bonding temperature is lower than soldering temperatures can be employed.

By using the above connecting structure and connecting method, it is possible to prevent the bonding member 30 such as solder from running out of the connecting region even with the connecting pitch lessened and to obtain a highly reliable connecting structure.

Figure 4:
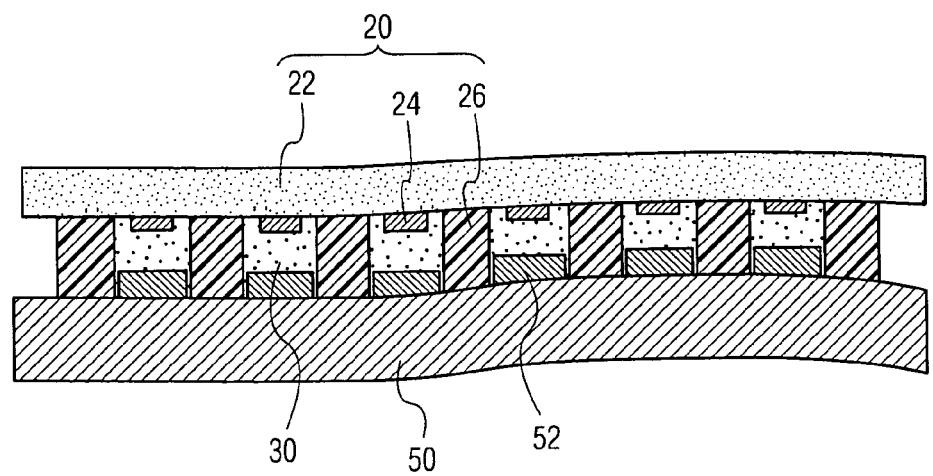
FIG. 4 is a diagram showing a modification example of an electronic circuit connecting structure of the exemplary embodiment.

Further, FIG. 4 is a sectional view showing a modification example of an electronic circuit connecting structure of the present exemplary embodiment. In this modification example, circuit board 50 has a curved shape, and the first connection land 52 is formed on the curved surface. The structure is such that the flexible board 20 described in the first exemplary embodiment is connected to the circuit board 50. Also in the case of this connecting structure, the interval between the respective connecting regions is prescribed by the insulating layer 26, and therefore, the bonding member 30 will not run out. Further, since it is possible to uniformly apply pressures to each connection land when pressed down, defective connection hardly takes place even on curved surfaces, thereby enabling the execution of reliable bonding.

Second Exemplary Embodiment

Figure 5:
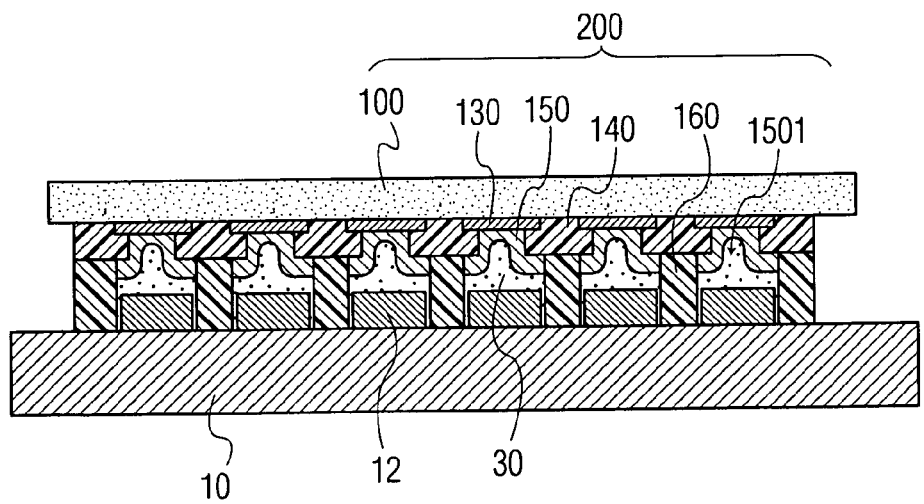
FIG. 5 is a sectional view of an electronic circuit connecting structure in the second exemplary embodiment of the present invention.

FIG. 5 is a sectional view of an electronic circuit connecting structure in the second exemplary embodiment of the present invention. In the present exemplary embodiment, the region of second connection land 150 of flexible board 200 comprises wiring conductor 130 formed corresponding to the first connection land 12 of the circuit board 10, first insulating layer 140 for covering the wiring conductor 130, region where the wiring conductor 130 is exposed via the opening formed in the first insulating layer 140, second insulating layer 160 formed so as to surround at least a part of outer periphery of the region, and second connection land 150 formed on the first insulating layer 140 and the region, which is surrounded by the second insulating layer 160.

The circuit board 10 has the first connection land 12 at least on the surface layer, the same as in the circuit board of the first exemplary embodiment. With the first connection land 12 of the circuit board 10 and the second connection land 150 of flexible board 200 positioned and bonded to each other by bonding member 30, an electronic circuit connecting structure of this exemplary embodiment can be obtained. In this exemplary embodiment, the second connection land 150 is provided with depression 1501 at the center thereof as shown in FIG. 5, and the bonding member 30 flows into the depression 1501 as well. Also, the first insulating layer 140 and the second insulating layer 160 prescribe the interval between the circuit board 10 and the flexible board 200. Thus, due to the two-layer configuration of the first insulating layer 140 and the second insulating layer 160, the insulating layer can be easily formed by a printing method while sufficiently obtaining the interval between the circuit board 10 and the flexible board 200.

Also, even when the flexible board 200 and the circuit board 10 are positioned with a specified pressure applied thereto, the bonding member 30 will not run outside because it is reliably enclosed in the region surrounded by the first insulating layer 140, the second insulating layer 160, and the first connection land 12. Further, since the second connection land 150 is provided with the depression 1501, the area bonded by the bonding member 30 can be increased, thereby enhancing the bonding strength.

The total thickness of the first insulating layer 140 and the second insulating layer 160 can be determined in the same way as in the first exemplary embodiment. In this exemplary embodiment, however, it is also necessary to take into account the volume of depression 1501.

An electronic circuit connecting method of the present exemplary embodiment will be described in the following by using FIG. 6A to FIG. 7B.

Figure 6A:
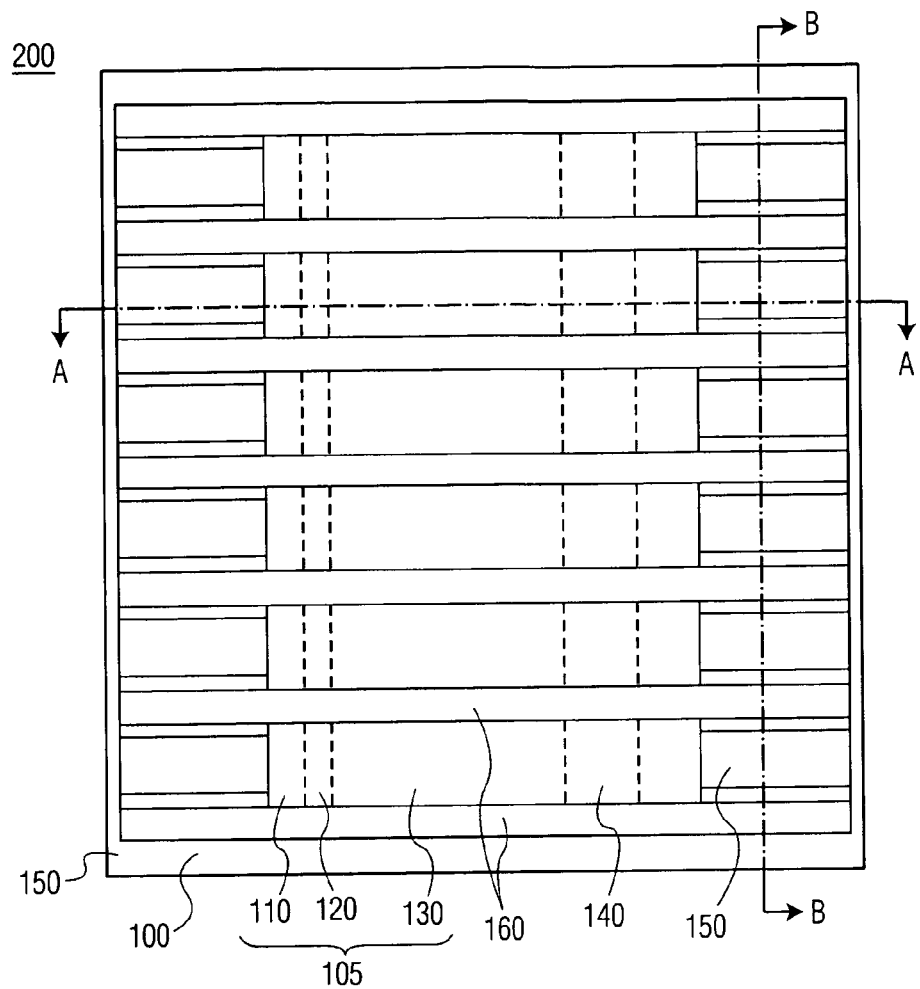
FIG. 6A is a plan view showing an example of flexible board used for electronic circuits of the exemplary embodiment.
Figure 6B:
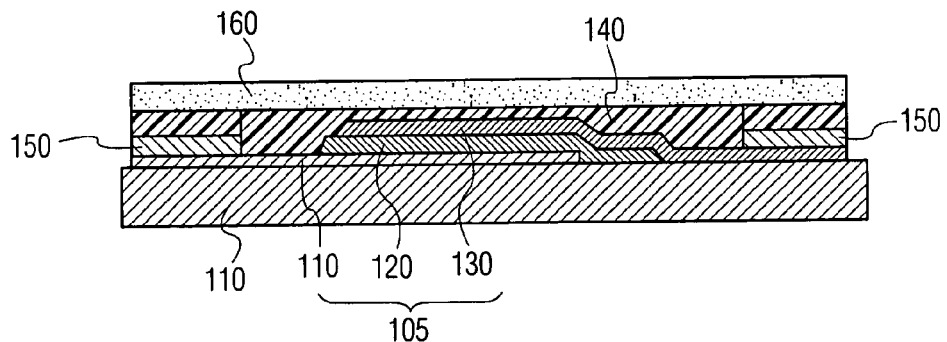
FIG. 6B is a sectional view along the A—A line shown in FIG. 6A.

FIG. 6A is a plan view showing an example of flexible board 200 using electronic circuits of the present exemplary embodiment. Also, FIG. 6B is a sectional view along the A—A line shown in FIG. 6A. In this exemplary embodiment, the flexible board 200 is formed with capacitor element 105 in an array type, and second connection land 150 at the extension of each wiring conductor 110, 130. As is seen in FIG. 6A and FIG. 6B, in the flexible board 200, the capacitor element 105 is formed on substrate 100 with dielectric layer 120 sandwiched between the wiring conductors 110, 130. The wiring conductors 110, 130 and the dielectric layer 120 are formed for example by sputtering. As the material for wiring conductors 110, 130, for example, aluminum (Al) and copper (Cu) are preferable, but it is also preferable to employ a laminated configuration for improving the adhesion or to use tantalum (Ta), nickel (Ni), gold (Au) or silver (Ag). As the dielectric layer 120, it can be formed by sputtering silicon oxide ($SiO_2$), titanium oxide ($TiO_2$), tantalum oxide ($Ta_2O_5$), strontium titanate ($SrTiO_3$), lead zirconate titanate ($Pb(Zr_xTi_{1-x})O_3$) and the like which are inorganic dielectric materials. Also, it is possible to use organic resin materials.

After forming the capacitor element 105, an opening is formed at only the region to become the second connection land 150, and the first insulating layer 140 is formed on other surfaces. As the first insulating layer 140, it can be easily manufactured by printing solder resist or UV setting resin. The total thickness of the first insulating layer 140 and the second insulating resin 160 is determined as described above, but each of the first insulating layer 140 and the second insulating layer 160 is formed so that the thickness is nearly the half of the total thickness.

Next, the second insulating layer 160 is formed in stripe pattern between the capacitor elements 105. Then the thickness is nearly equal to the thickness of the first insulating layer 140. In this way, a region with the wiring conductors 110, 130 exposed, which is surrounded by the second insulating layer 160, can be obtained, and the second connection land 150 is formed in the region. As the second connection land 150, it is also preferable to form for example a three-layer film of Cu—Ni—Au by sputtering, or by plating. Through the process, the flexible board 200 can be manufactured.

Next, by using FIG. 7A and FIG. 7B, a method of manufacturing an electronic circuit connecting structure by bonding the circuit board 10 and the flexible board 200 will be described in the following. In the present exemplary embodiment, the second connection land 150 is formed in two opposing directions on the flexible board 200, but since the method of connecting to the circuit board 10 is same as described earlier, the connecting structure at the section along the B—B line shown in FIG. 6A and the connecting method are described in the following.

Figure 7A:
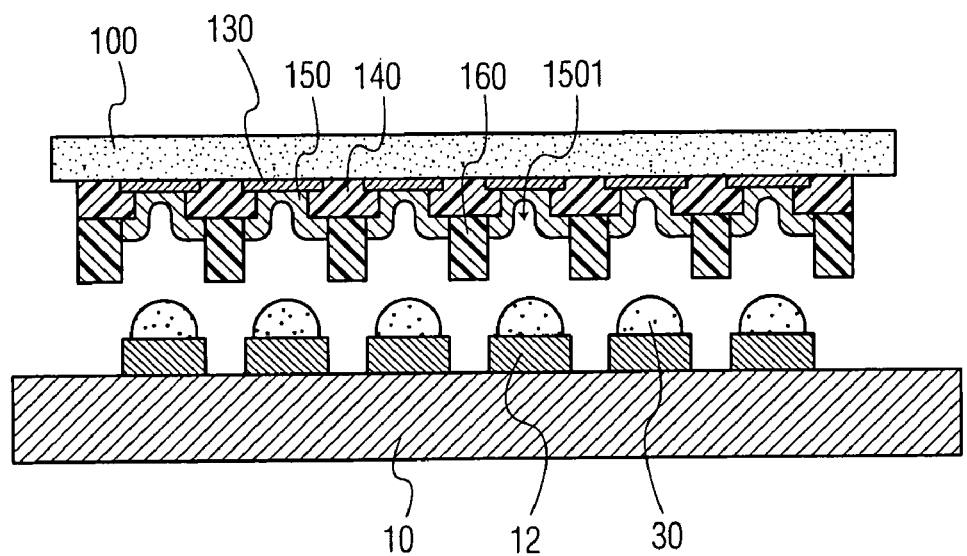
FIG. 7A is a diagram for describing the positioning of a circuit board and a flexible board in an electronic circuit connecting method of the exemplary embodiment.

As shown in FIG. 7A, the circuit board 10 with the bonding member 30 formed on the first connection land 12 is positioned to the flexible board 200. In this case, the positioning is made in such manner that the space between the first connection lands 12 of the circuit board 10 engages the second insulating layer 160 of the flexible board 200. The bonding member 30 is formed on only the first connection land 12 the same as in the first exemplary embodiment.

Figure 7B:
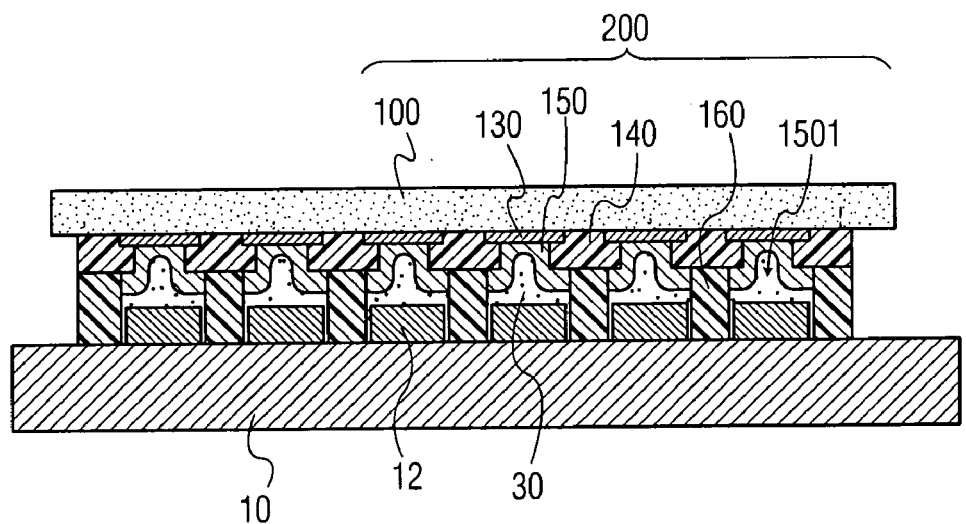
FIG. 7B is a diagram for describing the step of bonding a flexible board against a circuit board with use of a bonding member in an electronic circuit connecting method of the exemplary embodiment.

After that, as shown in FIG. 7B, the flexible board 200 is pressed down until the second insulating layer 160 comes in contact with the surface of the circuit board 10. In this case, the interval between the flexible board 200 and the circuit board 10 is prescribed by the first insulating layer 140 and the second insulating layer 160. Also, since the bonding member 30 is surrounded by the first insulating layer 140 and the second insulating layer 160, the bonding member 30 will not run out of the connecting region. Also, the second connection land 150 is provided with depression 1501, and the bonding member 30 gets into the depression 1501 as well. Thus, the bonding member 30 can be prevented from running out of the connecting region. Also, such depression 1501 results in increase of the bonding area, and thereby may enhance the bonding strength.

After finishing the above procedure, heating the bonding member 30 at least will complete the bonding between the first connection land 12 and the second connection land 150.

As the bonding member 30, it is possible to employ solder most frequently used for mounting electronic parts or conductive adhesive and the like whose bonding temperature is lower than soldering temperatures.

In the connecting structure as described above, it is possible to prevent the bonding member 30 from running out to adjacent lands and causing the generation of short-circuit trouble. Particularly, even with the connecting pitch lessened, short-circuit trouble hardly takes place and it is possible to obtain a highly reliable electronic circuit connecting structure. Also, since the first insulating layer 140 and the second insulating layer 160 are configured in two layers, the necessary thickness of each layer is about a half of the finally required thickness, making it easier to form a thick layer. Further, the first insulating layer 140 also serves as a protective layer for capacitor element 105, and highly reliable electronic circuits can be manufactured with excellent mass-productivity.

In this exemplary embodiment, the capacitor element 105 formed in array type on the flexible board 200 has been described, but the present invention is not limited to this. It is preferable to use a flexible board formed with resistor elements as well as capacitor elements, and also to use a flexible board mounted with chip capacitors or chip resistors, or a flexible board mounted with semiconductors. Further, the flexible board is preferable to be provided with at least one passive element or functional circuit element formed by film forming method, and the first insulating layer is preferable to be formed on the passive element or functional circuit element surface. In this way, for example, the first insulating layer including the wiring conductor can be formed on the capacitor element or resistor element surface formed by thin film forming technique such as evaporation or the like. As a result, it is possible to easily obtain an electronic circuit connecting structure with a highly reliable flexible board connected to a circuit board.

Also, the second connection land 150 is not always required to be formed in two opposing rows as in the present exemplary embodiment, but it is preferable to be formed in only one row or three rows and the like.

Third Exemplary Embodiment

An electronic circuit connecting method in the third exemplary embodiment of the present invention will be described with reference to FIG. 8A to FIG. 8G. An electronic circuit connecting structure manufactured by the electronic circuit connecting method of the present exemplary embodiment is shown in FIG. 8G, which is identical in shape with the electronic circuit connecting structure shown in FIG. 1.

Firstly, the electronic circuit connecting structure of the present exemplary embodiment will be described with reference to FIG. 8G. Circuit board 300 is formed with a land (not shown) where electronic parts (not shown) are mounted and conductor patterns (not shown) for connecting these parts, and further, the first connection land 302 having a part of such conductor patterns is formed on the surface layer thereof. The circuit board 300 is also preferable to be formed with multilayer wiring, internally equipped with electronic parts or formed with passive parts and the like by a film forming method. These configurations are not subjected to any particular limitations. Electronic parts represents a general term for passive parts and semiconductor elements.

Flexible board 316 comprises substrate 312, second connection land 314 having a part of conductor patterns formed on the substrate 312. The flexible board 316 is also extended from the second connection land 314 and formed with a plurality of conductor patterns which are however not shown. Also, in some cases, electronic parts are mounted in such manner as to be connected to conductor patterns, or passive elements or functional circuit elements are formed by a film forming method. As passive elements, for example, resistor elements, capacitor elements or inductor elements are typical examples. Also, as functional circuit elements, for example, there are sensors and thin film transistors.

The space between the flexible board 316 and the circuit board 300 is prescribed by insulating layer 304 fitted in the gap between the first connection lands 302. Further, the first connection land 302 and the second connection land 314 are bonded to each other by bonding member 310. The electronic circuit connecting structure of the present exemplary embodiment is configured as described above. As the bonding member 310, it is preferable to form the member on the first connection land 302 by a printing method with the use of generally available cream solder in order to execute solder bonding. Or, it is preferable to form the member similarly by a printing method with the use of conductive adhesive in order to execute adhesive bonding.

The electronic circuit connecting method of the present exemplary embodiment will be described in the following with reference to FIG. 8A to FIG. 8G.

Figure 8A:
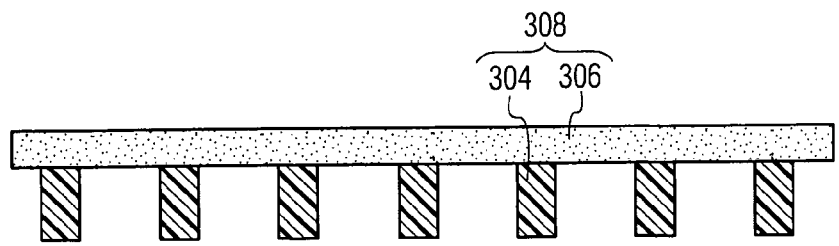
FIG. 8A is a sectional view of a transfer member with an insulating layer formed on a transfer substrate in the electronic circuit connecting method in the third exemplary embodiment of the present invention.

FIG. 8A is a sectional view of transfer member 308 provided with insulating layers 304 having a specified width and thickness which are arranged with predetermined pitches. The transfer member 308 is configured in that the insulating layer 304 is fixed on transfer substrate 306 by means of adhesive or the like.

In this exemplary embodiment, the space between the flexible board 316 and the circuit board 300 is prescribed, and the insulating layer 304 that prevents the bonding member 310 from running out is formed separate from the flexible board 316.

The transfer member 308 is for example formed as described in the following. As the transfer substrate 306, a material having an adhesive surface is employed. As described in the first exemplary embodiment, a resin sheet being thicker than the total thickness of the first connection land 302 and the second connection land 314 is affixed to the transfer substrate 306. Subsequently, resin sheet patterning is executed in such manner that the patterns are nearly equal in width and pitch to the gaps between the first connection lands 302 of the circuit board 300 shown in FIG. 8B. This patterning process can be executed, for example, by a laser beam machining process, photolithography process and etching process, or mechanical process. Generally, the region bonded by the bonding member 310 is a few millimeters in length and linear in most cases, and therefore, the intended shape can be easily obtained by the above-mentioned process.

Figure 8B:
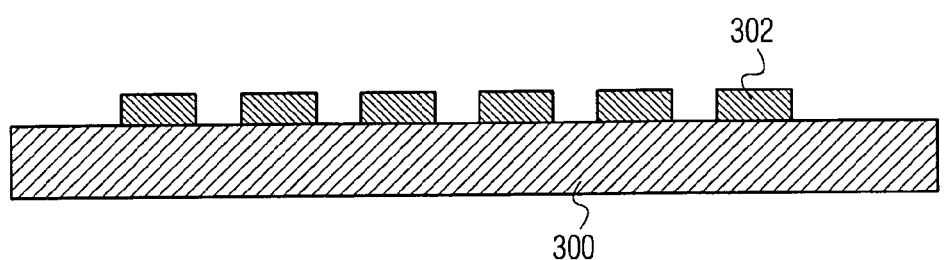
FIG. 8B is a sectional view of one circuit board comprising the bonding member of an electronic circuit in the electronic circuit connecting method of the exemplary embodiment.

FIG. 8B is a sectional view of one circuit board 300 having electronic circuit bonding members. The circuit board 300 is at least formed with the first connection land 302 on the surface layer thereof as described above.

Figure 8C:
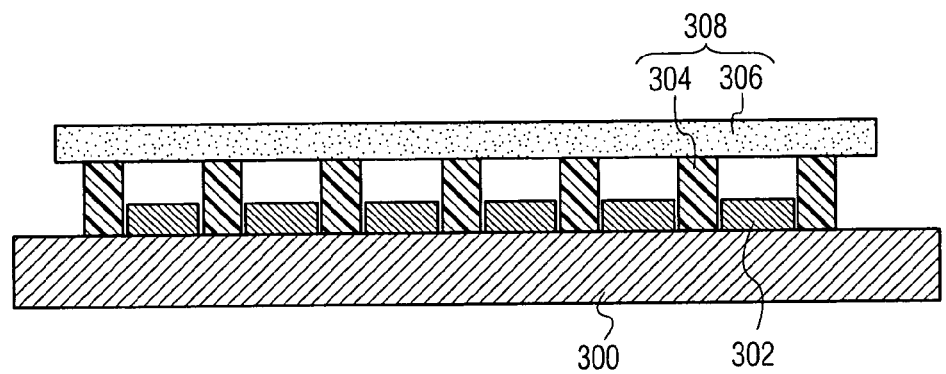
FIG. 8C is a sectional view showing a state of a transfer member positioned to the circuit board in the electronic circuit connecting method of the exemplary embodiment.

FIG. 8C is a sectional view showing a state of the transfer member 308 positioned to the circuit board 300. Before positioning, adhesive is applied to the surface layer of the insulating layer 304 formed on the transfer member 308, or adhesive is applied to the gap portion between the first connection lands 302. With it positioned and pressed, and heated as needed, the adhesive hardens, then the insulating layer 304 is secured on the circuit board 300.

Figure 8D:
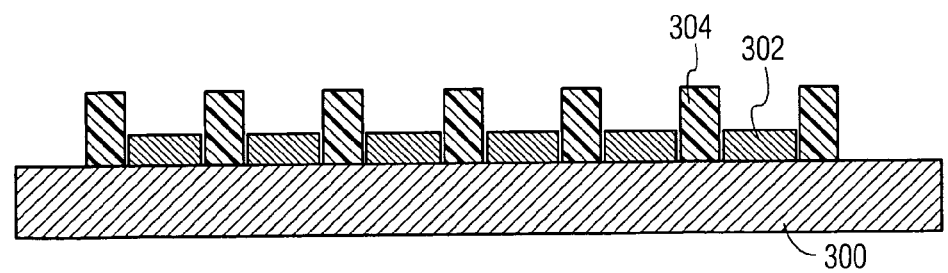
FIG. 8D is a sectional view showing a state of a transfer member with transfer substrate removed after securing the insulating layer in the electronic circuit connecting method of the exemplary embodiment.

FIG. 8D is a sectional view is a sectional view showing a state of the transfer member 308 with the transfer substrate 306 removed after securing the insulating layer 304. As a method of removing the insulating layer 304 from the transfer substrate 306, the purpose can be achieved by making the adhesion between the insulating layer 304 and the circuit board 300 higher than the adhesion between the insulating layer 304 and the transfer substrate 306. Or, it is preferable to use a material having such characteristics that the adhesive applied to the transfer substrate 306 loses its adhesivity due to the light applied or a material losing its adhesivity due to heat. In this way, the insulating layer 304 is completely secured on the surface of the circuit board 300.

Figure 8E:
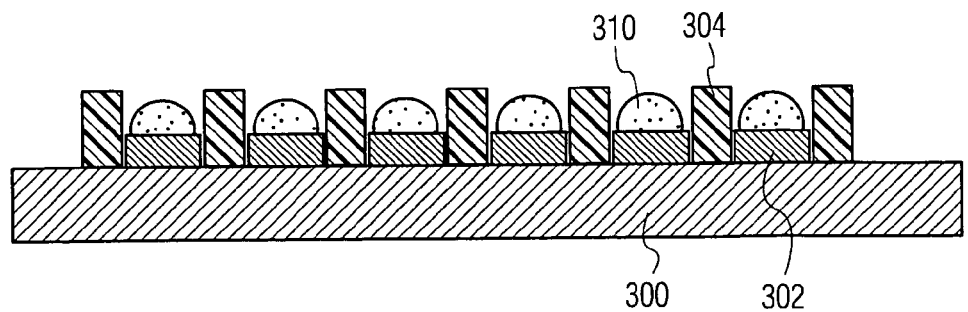
FIG. 8E is a sectional view showing a state of bonding member applied to the surface of the first connection land in the electronic circuit connecting method of the exemplary embodiment.

FIG. 8E is a sectional view showing a state of bonding member 310 applied to the surface of the first connection land 302. In the present exemplary embodiment, the same as in the first exemplary embodiment, the amount of the bonding member 310 applied is prescribed. In this exemplary embodiment, since the insulating layer 304 is previously disposed on both sides of the first connection land 302, the bonding member 310 applied will not be forced out of the first connection land 302. For the application of the bonding member 310, for example, a drawing method is most efficient, but it is also preferable to employ an ink jet method or the like.

Figure 8F:
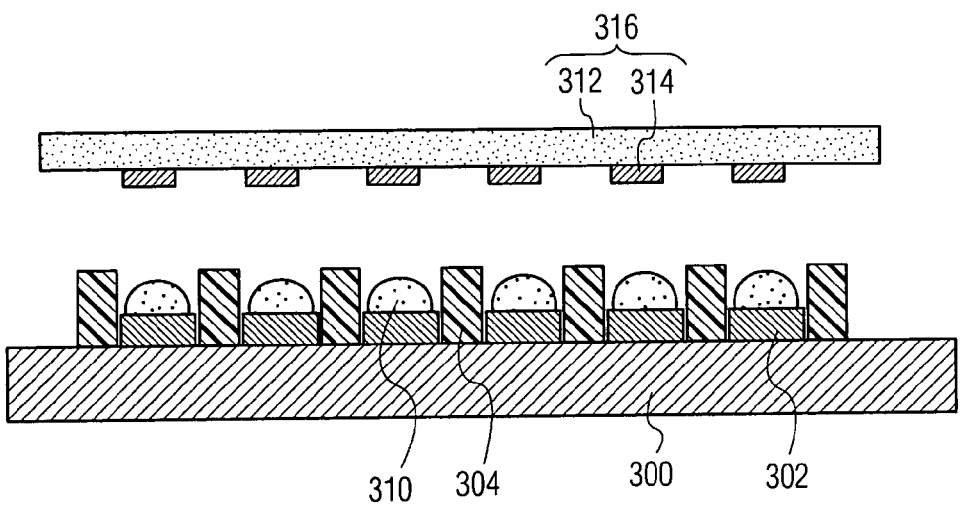
FIG. 8F is a sectional view showing a state of a flexible board positioned with respect to the circuit board with bonding member applied in the electronic circuit connecting method of the exemplary embodiment.
Figure 8G:
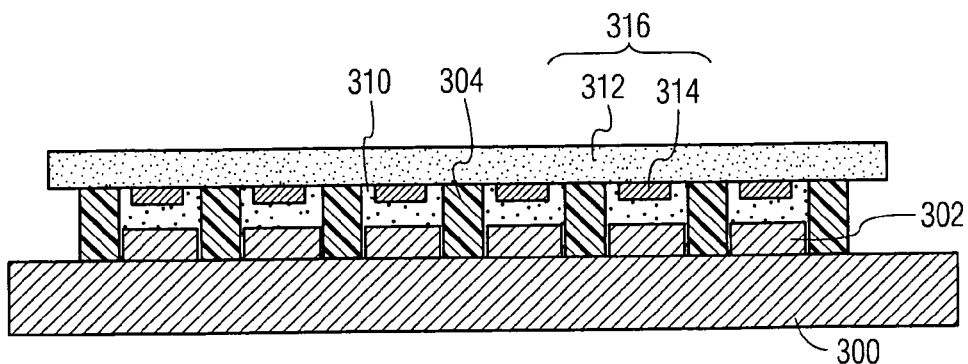
FIG. 8G is a sectional view showing a state of the first connection land and the second connection land heated and connected by bonding member after positioning the flexible board to the circuit board in the electronic circuit connecting method of the exemplary embodiment.

FIG. 8F is a sectional view showing a state of the flexible board 316 positioned with respect to the circuit board 300 with the bonding member 310 applied. The second connection land 314 is formed on the flexible board 316, but no insulating layer is provided unlike the first exemplary embodiment.

FIG. 8G is a sectional view showing a state of the first connection land 302 and the second connection land 314 heated and connected by the bonding member 310 after positioning the flexible board 316 to the circuit board 300.

With use of the above connecting method, it is possible to prevent the bonding member 310 such as solder from running out of the connecting region even with the connecting pitch lessened and to obtain a highly reliable connecting structure.

As the substrate 312, it is preferable to use polyimide resin film which is generally employed as the flexible board 316, but the present invention is not limited to this. When conductive adhesive is used as the bonding member 310, the bonding temperature is lower than soldering temperatures, and for example, it is also possible to use polyethylene terephthalate (PET) resin film or the like.

Also, as the bonding member 310, it is possible to use solder that is most frequently used for mounting electronic parts or conductive adhesive or the like whose bonding temperature is lower than soldering temperatures.

What is claimed is:

1. An electronic circuit connecting structure comprising:
a circuit board with a plurality of first connection lands, which are conductor patterns, formed on a surface thereof; and
a flexible board arranged opposite to the circuit board, the flexible board including:
a plurality of second connection lands arranged opposite to the respective plurality of first connection lands of the circuit board, a width of each second connection land being narrower than a width of each first connection land; and
an insulating layer formed so as to surround a part of an outer periphery of each of the second connection lands without completely surrounding each outer periphery, the insulating layer including a plurality of insulating strips, each insulating strip disposed between adjacent second connection lands and provided such that a space is formed between the outer periphery of each of the second connection lands and each of the insulating strips and such that the first connection lands and the insulating strips touch,
wherein each of the first connection lands and each of the second connection lands are bonded to each other via one of a respective plurality of bonding members, and
a thickness of the insulating layer is greater than a total thickness of the first connection lands and the second connection lands.

2. The electronic circuit connecting structure of claim 1, wherein a thickness of the first connection lands is greater than a thickness of the second connection lands.

3. The electronic circuit connecting structure of claim 1, wherein a width of the first connection lands is greater than a width of the second connection lands.

4. The electronic circuit connecting structure of claim 1, wherein the insulating layer is fitted in a grooved portion formed between the plurality of first connection lands.

5. The electronic circuit connecting structure of claim 1, wherein each of the bonding members is solder or conductive adhesive.

6. The circuit board according to claim 1, wherein the insulating layer is disposed adjacent to and between each of the first connection lands, and
each of the plurality of bonding members is provided in each of a respective further plurality of spaces formed by the insulating layer, each of the first connection lands, each of the second connection lands, and each of the spaces.

* * * * *